(12) United States Patent
Chen

(10) Patent No.: US 10,840,391 B1
(45) Date of Patent: Nov. 17, 2020

(54) LIGHT FILTER STRUCTURE

(71) Applicant: VisEra Technologies Company Limited, Hsin-Chu (TW)

(72) Inventor: Yu-Jen Chen, Taoyuan (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/396,424

(22) Filed: Apr. 26, 2019

(51) Int. Cl.
| | | |
|---|---|---|
| *H01L 31/0216* | (2014.01) | |
| *H01L 27/144* | (2006.01) | |
| *G01J 3/28* | (2006.01) | |
| *G02B 5/20* | (2006.01) | |
| *G01J 3/02* | (2006.01) | |

(52) U.S. Cl.
CPC ...... *H01L 31/02165* (2013.01); *G01J 3/0229* (2013.01); *G01J 3/2803* (2013.01); *G02B 5/20* (2013.01); *H01L 27/1446* (2013.01); *H01L 31/02164* (2013.01)

(58) Field of Classification Search
CPC ......... H01L 31/02162; H01L 31/02164; H01L 31/02165; G01J 3/0229; G01J 3/2803; G02B 5/20
See application file for complete search history.

(56) References Cited

U.S. PATENT DOCUMENTS

| | | | | |
|---|---|---|---|---|
| 2005/0064303 A1* | 3/2005 | Yamada | ..................... | G03F 1/54 430/5 |
| 2009/0009451 A1* | 1/2009 | Hamagishi | ............. | G02B 30/27 345/87 |
| 2009/0200625 A1* | 8/2009 | Venezia | .............. | H01L 27/1464 257/432 |
| 2010/0038523 A1* | 2/2010 | Venezia | ........... | H01L 27/14629 250/216 |
| 2013/0240708 A1 | 9/2013 | Kokubun | | |
| 2017/0005132 A1 | 1/2017 | Vereecke et al. | | |
| 2017/0236861 A1* | 8/2017 | Ockenfuss | ................ | G01J 3/36 257/432 |
| 2018/0267220 A1* | 9/2018 | Frey | ....................... | G02B 5/286 |

FOREIGN PATENT DOCUMENTS

| | | |
|---|---|---|
| CN | 103208497 A | 7/2013 |
| CN | 105742306 A | 7/2016 |
| TW | 201740142 A | 11/2017 |

OTHER PUBLICATIONS

Office Action dated Feb. 12, 2020 in TW Application No. 108119266.

* cited by examiner

*Primary Examiner* — Hsien Ming Lee
(74) *Attorney, Agent, or Firm* — Muncy, Geissler, Olds & Lowe, P.C.

(57) ABSTRACT

A light filter structure is provided. The light filter structure includes a substrate having a plurality of photoelectric conversion elements. The light filter structure also includes a first metal-stacking layer disposed on the substrate. The light filter structure further includes a graded layer disposed on the first metal-stacking layer. The graded layer has a continuously or non-continuously varied thickness. The light filter structure includes a flatting layer disposed on the graded layer. The light filter structure also includes a second metal-stacking layer disposed on the flatting layer.

20 Claims, 6 Drawing Sheets

LIGHT FILTER STRUCTURE

BACKGROUND

Technical Field

Embodiments of the present disclosure relate to a light filter structure. More specifically, the present disclosure relates to a light filter structure that includes a graded layer.

Description of the Related Art

Light filters have been widely used in various devices, such as spectrum meters, ambient light sensors, color sensors, image sensors, spectral inspection devices, and so on. However, traditional light filter structures may not satisfy demands in every respect. For example, when a traditional light filter structure is used as a narrow-band pass filter, it is usually very thick. Moreover, the spectrum obtained from the traditional light filter structure may have unexpected deformation due to oblique incident-light. Furthermore, it is hard to reduce the size of the traditional light filter structure to, for example, a few micrometers to meet demand.

SUMMARY

In accordance with some embodiments of the present disclosure, a light filter structure is provided. The light filter structure includes a substrate having a plurality of photoelectric conversion elements. The light filter structure also includes a first metal-stacking layer disposed on the substrate. The light filter structure further includes a graded layer disposed on the first metal-stacking layer. The graded layer has a continuously or non-continuously varied thickness. The light filter structure includes a flatting layer disposed on the graded layer. The light filter structure also includes a second metal-stacking layer disposed on the flatting layer.

BRIEF DESCRIPTION OF THE DRAWINGS

Aspects of the embodiments of the present disclosure may be understood from the following detailed description when reading with the accompanying figures. It should be noted that, in accordance with the standard practice in the industry, various features are not drawn to scale. In fact, the dimensions of the various features may be arbitrarily increased or reduced for easy and clear discussion.

DETAILED DESCRIPTION

Figure 1:
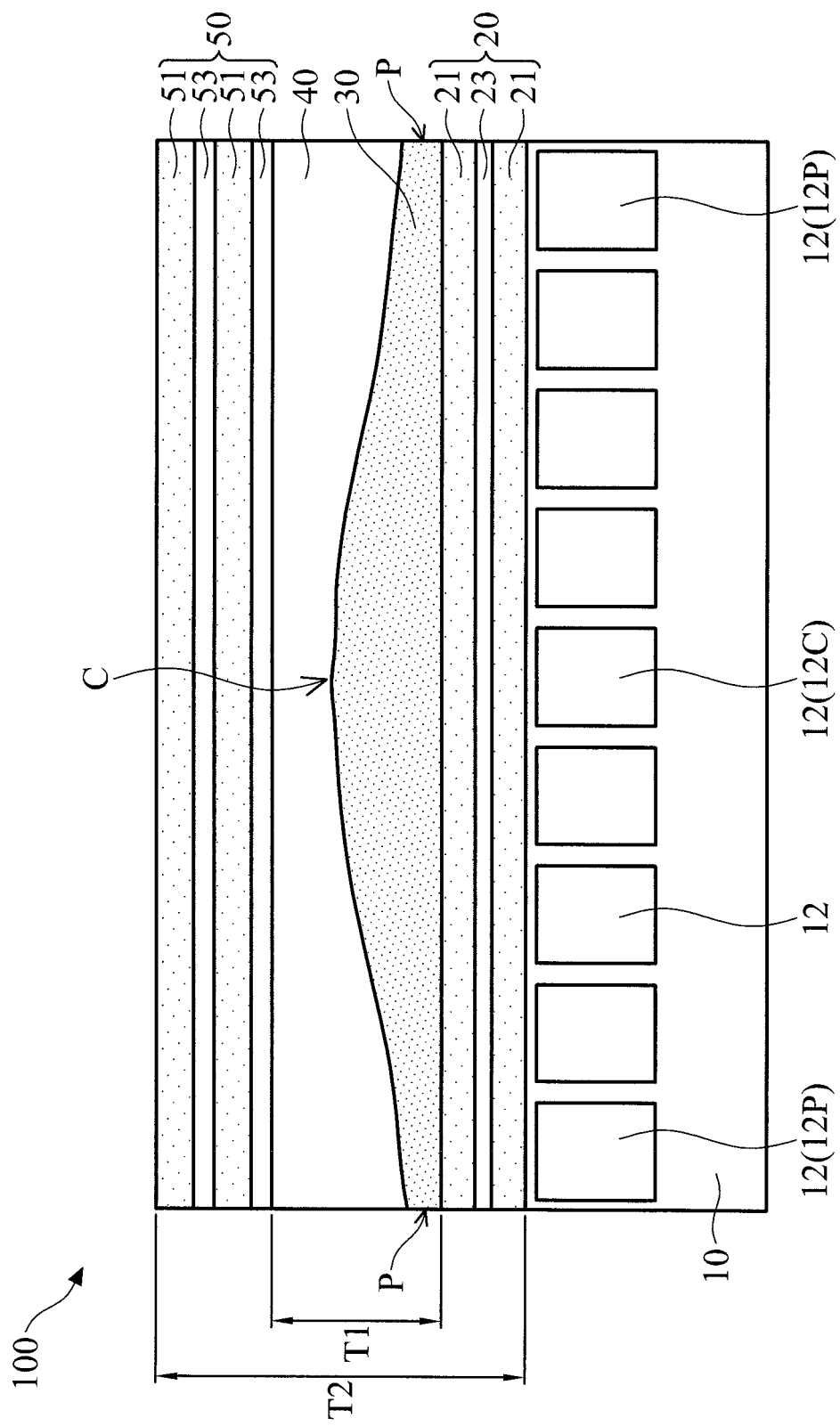
FIG. 1 is a partial cross-sectional view illustrating a light filter structure according to one embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 45 degrees or at other orientations) and the spatially relative descriptors used herein may likewise be interpreted accordingly.

In the present disclosure, the terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about" and "substantially", the stated value still includes the meaning of "about" or "substantially".

It should be understood that, although the terms "first," "second," "third," etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

FIG. 1 is a partial cross-sectional view illustrating a light filter structure 100 according to one embodiment of the present disclosure. It should be noted that not all components of the light filter structure 100 are shown in FIG. 1, for the sake of brevity.

Referring to FIG. 1, the light filter structure 100 includes a substrate 10. In some embodiments, the material of the substrate 10 may include an elemental semiconductor (e.g., silicon, germanium), a compound semiconductor (e.g., tantalum carbide (TaC), gallium arsenide (GaAs), indium arsenide (InAs) or indium phosphide (InP)), an alloy semiconductor (e.g., silicon germanium (SiGe), silicon germanium carbide (SiGeC), gallium arsenic phosphide (GaAsP) or gallium indium phosphide (GaInP)), any other applicable semiconductor, or a combination thereof, but the present disclosure is not limited thereto.

In some embodiments, the substrate 10 may be a semiconductor-on-insulator (SOI) substrate. The semiconductor-on-insulator substrate may include a bottom substrate, a buried oxide layer disposed on the bottom substrate, and a semiconductor layer disposed on the buried oxide layer. In some embodiments, the substrate 10 may be a semiconductor wafer (e.g., a silicon wafer, or any other applicable semiconductor wafer). In some embodiments, the material of the substrate 10 may include, but is not limited to, at least one of the following: ceramic, glass, polyimide (PI), liquid-crystal polymer (LCP), polycarbonate (PC), polypropylene (PP), polyethylene terephthalate (PET) (and other plastic), a polymer material, or a combination thereof.

In some embodiments, the substrate 10 may include various conductive features (e.g., conductive lines or vias). For example, the conductive features may be made of aluminum (Al), copper (Cu), tungsten (W), an alloy thereof, any other applicable conductive material, or a combination thereof, but the present disclosure is not limited thereto.

As shown in FIG. 1, the substrate 10 may have a plurality of photoelectric conversion elements 12. In some embodiments, the photoelectric conversion elements 12 may be formed by a process such as an ion implantation process and/or a diffusion process. For example, the photoelectric conversion elements 12 may be configured to form transistors, photodiodes, PIN diodes and/or light-emitting diodes, but the present disclosure is not limited thereto.

Referring to FIG. 1, the light filter structure 100 includes a first metal-stacking layer 20 disposed on the substrate 10. In this embodiment, the first metal-stacking layer 20 may include at least one metal layer 21 and at least one adhesion layer 23 stacked with the metal layer 21. That is, the metal layers 21 and the adhesion layer 23 may be alternately stacked with each other, for example. In FIG. 1, the first metal-stacking layer 20 includes two metal layers 21 and one adhesion layer 23 disposed between the two metal layers 21. In some embodiments, the total number of metal layers 21 and adhesion layers 23 in the first metal-stacking layer 20 may be between 4 and 15. However, the number of metal layers 21 and the number of adhesion layers 23 are not limited thereto.

In some embodiments, the material of the metal layer 21 may include gold (Au), copper (Cu), aluminum (Al), silver (Ag), nickel (Ni), or any other applicable metal, but the present disclosure is not limited thereto. In some embodiments, the material of the adhesion layer 23 may include titanium (Ti), chromium (Cr), zinc oxide (ZnO), aluminium oxide ($Al_2O_3$), or any other applicable material, but the present disclosure is not limited thereto. In some embodiments, the metal layer 21 and the adhesion layer 23 may be formed by a chemical vapor deposition process, an atomic layer deposition process, a physical vapor deposition process, or another suitable method, but the present disclosure is not limited thereto. For example, the chemical vapor deposition process may be low-pressure chemical vapor deposition, low-temperature chemical vapor deposition, rapid thermal chemical vapor deposition, or plasma-enhanced chemical vapor deposition. For example, the physical vapor deposition process may be a vacuum evaporation process or a sputtering process.

Referring to FIG. 1, the light filter structure 100 includes a graded layer 30 disposed on the first metal-stacking layer 20. As shown in FIG. 1, the graded layer 30 may have a continuously varied thickness in this embodiment, but the present disclosure is not limited thereto. In other embodiments, the graded layer 30 may also have a non-continuously varied thickness (e.g., the graded layer 33 shown in following FIG. 5).

In some embodiments, the material of the graded layer 30 may include dielectric materials. For example, the material of the graded layer 30 may include zirconium dioxide ($ZrO_2$), tantalum pentoxide ($Ta_2O_5$), niobium pentoxide ($Nb_2O_5$), zinc sulfide (ZnS), titanium dioxide ($TiO_2$), indium tin oxide (ITO), Tin oxide ($SnO_2$), zinc oxide (ZnO), calcium fluoride ($CaF_2$), magnesium fluoride ($MgF_2$), lanthanum trifluoride ($LaF_3$), silicon dioxide ($SiO_2$), aluminium oxide ($Al_2O_3$), hafnium dioxide ($HfO_2$), or any other applicable material, but the present disclosure is not limited thereto.

In some embodiments, the graded layer 30 may be formed by a chemical vapor deposition process, an atomic layer deposition process, a physical vapor deposition process, or another suitable method, but the present disclosure is not limited thereto. For example, the chemical vapor deposition process may be low-pressure chemical vapor deposition, low-temperature chemical vapor deposition, rapid thermal chemical vapor deposition, or plasma-enhanced chemical vapor deposition. Moreover, the graded layer 30 may be deposited on the first metal-stacking layer 20 by using a specific mask to form the graded layer 30 having a continuously varied thickness.

In this embodiment, the graded layer 30 may gradually thin from the center C of the graded layer 30 to the periphery P of the graded layer 30. That is, the thickness of the center C of the graded layer 30 may be the maximum thickness of the graded layer 30, while the thickness of the periphery P of the graded layer 30 may be the minimum thickness of the graded layer 30, but the present disclosure is not limited thereto.

Referring to FIG. 1, the light filter structure 100 includes a flatting layer 40 disposed on the graded layer 30. In this embodiment, the flatting layer 40 is a transparent layer, and the material of the flatting layer 40 may include a transparent photoresist, polyimide, epoxy resin, any other applicable material, or a combination thereof, but the present disclosure is not limited thereto.

In some embodiments, the material of the flatting layer 40 may include a light curing material, a thermal curing material, or a combination thereof. For example, a spin-on coating process may be performed to coat the transparent material on the graded layer 30, and then a planarization process may be performed to form the flatting layer 40, but the present disclosure is not limited thereto. For example, the planarization process may include a chemical mechanical polishing (CMP) process, a grinding process, an etching back process, any other applicable process, or a combination thereof.

In some embodiments, the refractive index of the graded layer 30 may be different from the refractive index of the flatting layer 40. For example, the refractive index of the flatting layer 40 may be less than the refractive index of the graded layer 30 in FIG. 1, but the present disclosure is not limited thereto.

Moreover, in this embodiment, the total thickness T1 of the graded layer 30 and the flatting layer 40 from the center of the light filter 100 to the periphery of the light filter 100 may be kept substantially constant, and the volume ratio of the flatting layer 40 to the graded layer 30 may decide the equivalent refractive index at different positions.

Referring to FIG. 1, the light filter structure 100 includes a second metal-stacking layer 50 disposed on the flatting layer 40. Similarly, the second metal-stacking layer 50 may include at least one metal layer 51 and at least one adhesion layer 53 stacked with the metal layer 51. That is, the metal layers 51 and the adhesion layers 53 may be alternately stacked with each other, for example. In FIG. 1, the second metal-stacking layer 50 includes two metal layers 51 and two adhesion layers 53 alternately arranged with each other. In some embodiments, the total number of metal layers 51 and adhesion layers 53 in the second metal-stacking layer 50 may be between 4 and 15. However, the number of metal layers 51 and the number of adhesion layers 53 are not limited thereto.

In some embodiments, the material of the metal layer 51 may include gold (Au), copper (Cu), aluminum (Al), silver (Ag), nickel (Ni), or any other applicable metal, but the present disclosure is not limited thereto. In some embodiments, the material of the adhesion layer 53 may include titanium (Ti), chromium (Cr), zinc oxide (ZnO), aluminium oxide ($Al_2O_3$), or any other applicable material, but the present disclosure is not limited thereto. In some embodiments, the metal layer 51 and the adhesion layer 53 may be formed by a chemical vapor deposition process, an atomic layer deposition process, a physical vapor deposition process, or another suitable method, but the present disclosure is not limited thereto. For example, the chemical vapor deposition process may be low-pressure chemical vapor deposition, low-temperature chemical vapor deposition, rapid thermal chemical vapor deposition, or plasma-enhanced chemical vapor deposition. For example, the physical vapor deposition process may be a vacuum evaporation process or a sputtering process.

In some embodiments, the first metal-stacking layer 20 may include at least one metal layer 21, the second metal-stacking layer 50 may include at least one metal layer 51, and the first metal-stacking layer 20 and the second metal-stacking layer 50 may act as high-reflectors of Fabry-Perot resonator; furthermore, the total thickness T2 of the first metal-stacking layer 20, the graded layer 30, the flatting layer 40 and the second metal-stacking layer 50 may be thin (e.g., less than 3 µm). Therefore, the light filter structure 100 may be low angle dependency. That is, the deformation of the spectrum due to oblique incident-light transmitted to the light filter structure 100 may be reduced. For example, the blue light shift during 300 nm to 900 nm on Automated Optical Inspection (AOI) 30° may be less than or equal to 15 nm.

In the embodiment shown in FIG. 1, when the refractive index of the flatting layer 40 is less than the refractive index of the graded layer 30 (e.g., the refractive index of the flatting layer 40 is 1.5 and the refractive index of the graded layer 30 is 2.5), the closer a photoelectric conversion element 12 is to the center of the light filter 100, the longer the wavelength of the light transmitted to the photoelectric conversion element 12 is. For example, the photoelectric conversion element 12C is close to the center of the light filter 100, so that the red light is transmitted to the photoelectric conversion element 12C; the photoelectric conversion element 12P is close to the periphery of the light filter 100, so that the blue light is transmitted to the photoelectric conversion element 12P, but the present disclosure is not limited thereto.

In the embodiment shown in FIG. 1, when the refractive index of the flatting layer 40 is greater than the refractive index of the graded layer 30 (e.g., the refractive index of the flatting layer 40 is 2.5 and the refractive index of the graded layer 30 is 1.5), the closer a photoelectric conversion element 12 is to the center of the light filter 100, the shorter the wavelength of the light transmitted to the photoelectric conversion element 12 is. For example, the photoelectric conversion element 12C is close to the center of the light filter 100, so that the blue light is transmitted to the photoelectric conversion element 12C; the photoelectric conversion element 12P is close to the periphery of the light filter 100, so that the red light is transmitted to the photoelectric conversion element 12P, but the present disclosure is not limited thereto.

Figure 2:
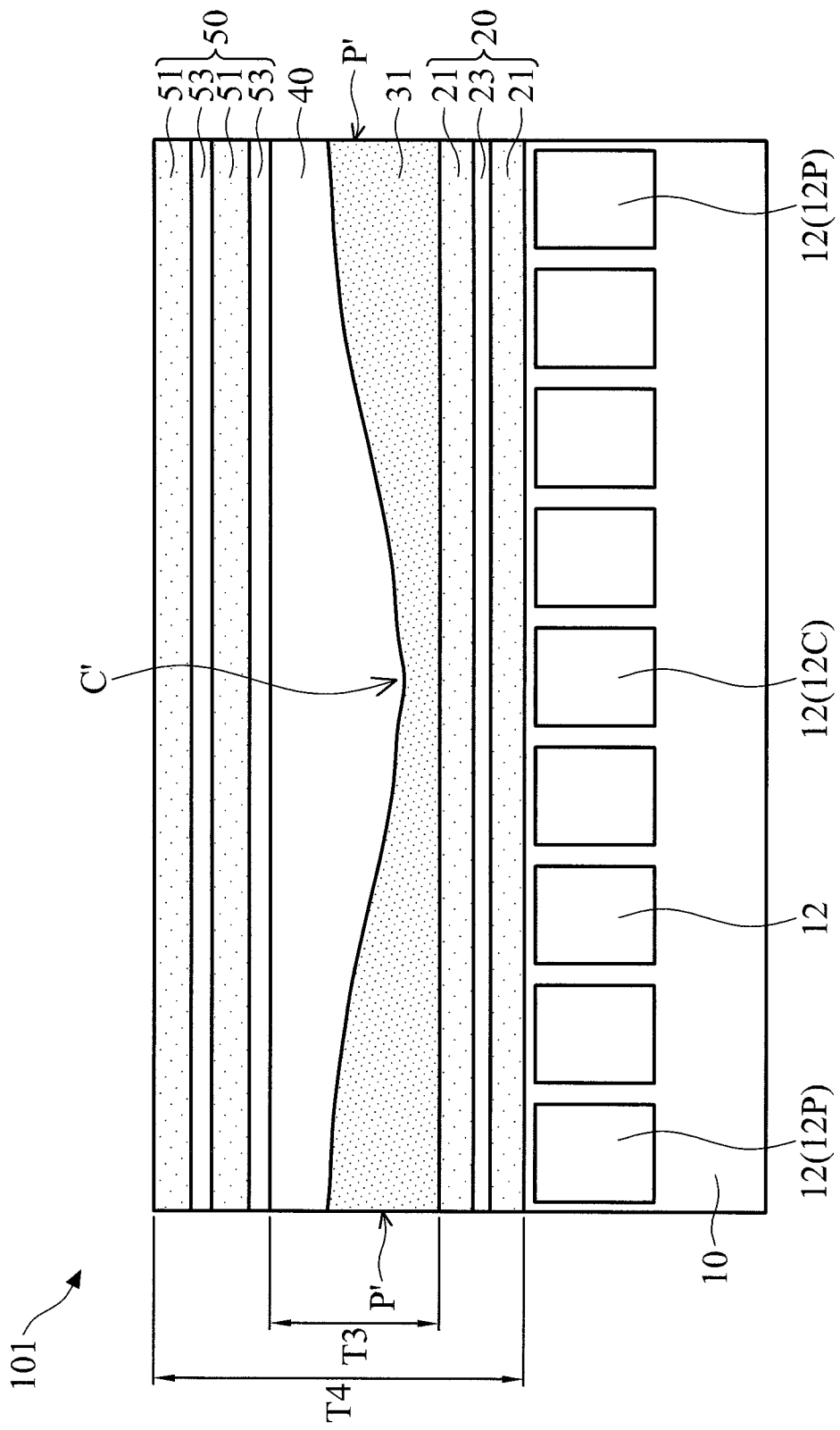
FIG. 2 is a partial cross-sectional view illustrating a light filter structure according to another embodiment of the present disclosure.

FIG. 2 is a partial cross-sectional view illustrating a light filter structure 101 according to another embodiment of the present disclosure. It should be noted that not all components of the light filter structure 101 are shown in FIG. 2, for the sake of brevity.

Referring to FIG. 2, the light filter structure 101 includes a substrate 10. Similarly, the substrate 10 may have a plurality of photoelectric conversion elements 12. The light filter structure 101 includes a first metal-stacking layer 20 disposed on the substrate 10. The light filter structure 101 also includes a graded layer 31 disposed on the first metal-stacking layer 20 and a flatting layer 40 disposed on the graded layer 31. The light filter structure 101 further includes a second metal-stacking layer 50 disposed on the flatting layer 40.

The difference from the light filter structure 100 shown in FIG. 1 may include that the graded layer 31 of the light filter structure 102 shown in FIG. 2 may gradually thicken from the center C' of the graded layer 31 to the periphery P' of the graded layer 31. That is, the thickness of the center C' of the graded layer 31 may be the minimum thickness of the graded layer 31, while the thickness of the periphery P' of the graded layer 31 may be the maximum thickness of the graded layer 31, but the present disclosure is not limited thereto.

In some embodiments, the material of the graded layer 31 shown in FIG. 2 may be substantially the same as the material of the graded layer 30 shown in FIG. 1, but the present disclosure is not limited thereto. Similarly, the refractive index of the graded layer 31 may be different from the refractive index of the flatting layer 40. For example, the refractive index of the flatting layer 40 may be less than the refractive index of the graded layer 31 in FIG. 2, but the present disclosure is not limited thereto.

Moreover, in this embodiment, the total thickness T3 of the graded layer 31 and the flatting layer 40 from the center of the light filter 101 to the periphery of the light filter 101 may be kept substantially constant, and the volume ratio of the flatting layer 40 to the graded layer 31 may decide the equivalent refractive index at different positions.

In some embodiments, the first metal-stacking layer 20 may include at least one metal layer 21, the second metal-stacking layer 50 may include at least one metal layer 51, and the first metal-stacking layer 20 and the second metal-stacking layer 50 may act as high-reflectors of Fabry-Perot resonator; furthermore, the total thickness T4 of the first metal-stacking layer 20, the graded layer 31, the flatting layer 40 and the second metal-stacking layer 50 may be thin (e.g., less than 3 µm). Therefore, the light filter structure 101 may be low angle dependency. That is, the deformation of the spectrum due to oblique incident-light transmitted to the light filter structure 101 may be reduced.

In the embodiment shown in FIG. 2, when the refractive index of the flatting layer 40 is less than the refractive index of the graded layer 31 (e.g., the refractive index of the flatting layer 40 is 1.5 and the refractive index of the graded layer 31 is 2.5), the closer a photoelectric conversion element 12 is to the center of the light filter 101, the shorter the wavelength of the light transmitted to the photoelectric conversion element 12 is. For example, the photoelectric conversion element 12C is close to the center of the light filter 101, so that the blue light is transmitted to the photoelectric conversion element 12C; the photoelectric conversion element 12P is close to the periphery of the light filter 101, so that the red light is transmitted to the photoelectric conversion element 12P, but the present disclosure is not limited thereto.

In the embodiment shown in FIG. 2, when the refractive index of the flatting layer 40 is greater than the refractive index of the graded layer 31 (e.g., the refractive index of the flatting layer 40 is 2.5 and the refractive index of the graded layer 31 is 1.5), the closer a photoelectric conversion element 12 is to the center of the light filter 101, the longer the wavelength of the light transmitted to the photoelectric conversion element 12 is. For example, the photoelectric conversion element 12C is close to the center of the light filter 101, so that the red light is transmitted to the photoelectric conversion element 12C; the photoelectric conversion element 12P is close to the periphery of the light filter 101, so that the blue light is transmitted to the photoelectric conversion element 12P, but the present disclosure is not limited thereto.

Figure 3:
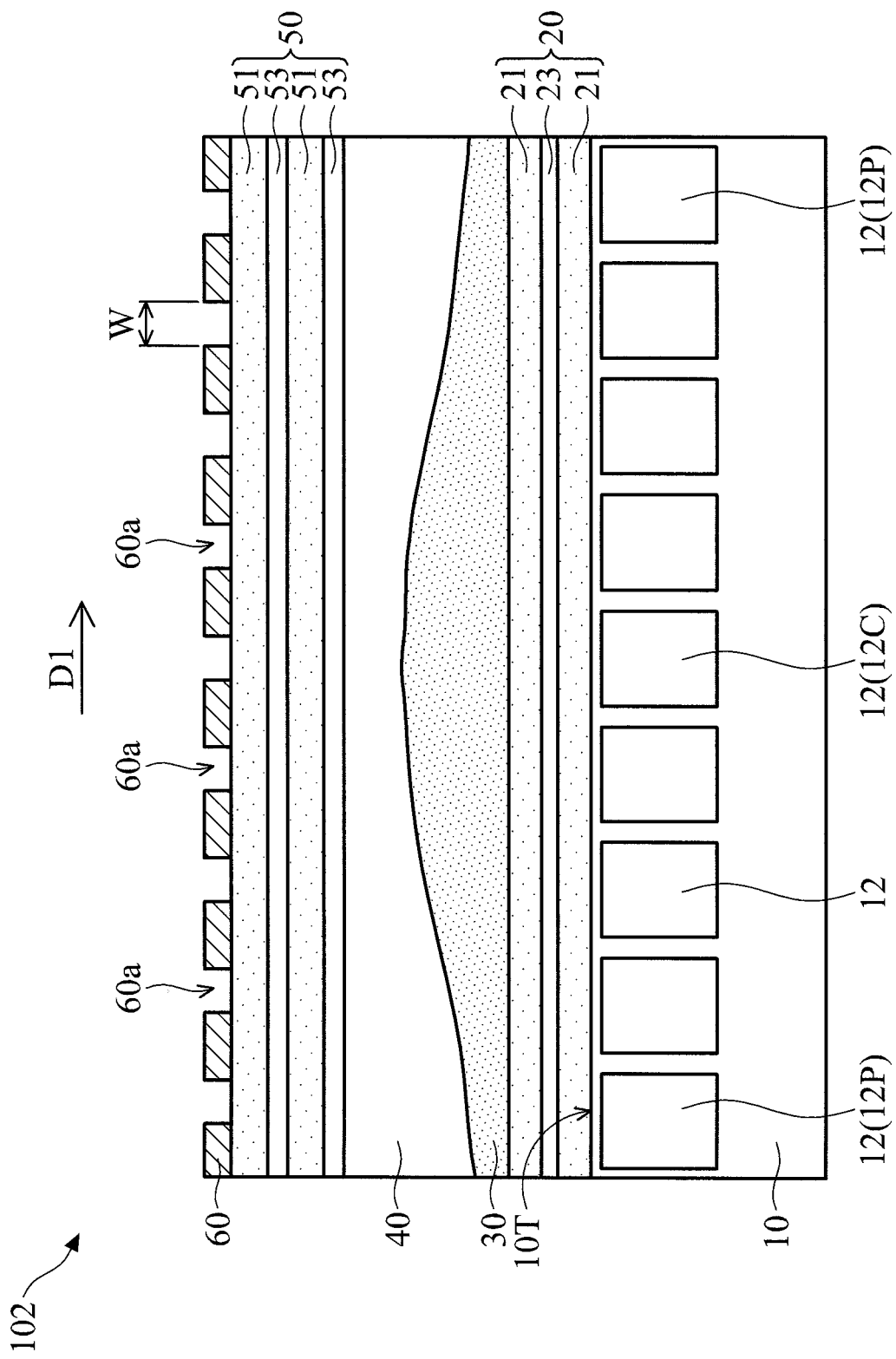
FIG. 3 is a partial cross-sectional view illustrating a light filter structure according to one embodiment of the present disclosure.

FIG. 3 is a partial cross-sectional view illustrating a light filter structure 102 according to one embodiment of the present disclosure. It should be noted that not all components of the light filter structure 102 are shown in FIG. 3, for the sake of brevity.

Referring to FIG. 3, the light filter structure 102 includes a substrate 10. Similarly, the substrate 10 may have a plurality of photoelectric conversion elements 12. The light filter structure 102 includes a first metal-stacking layer 20 disposed on the substrate 10. The light filter structure 102 also includes a graded layer 30 disposed on the first metal-stacking layer 20 and a flatting layer 40 disposed on the graded layer 30. The light filter structure 102 further includes a second metal-stacking layer 50 disposed on the flatting layer 40.

In this embodiment, the light filter structure 102 may further include a light-shielding layer 60 disposed on the second metal-stacking layer 50. As shown in FIG. 3, the light-shielding layer 60 may include a plurality of apertures 60a. In some embodiments, each of the apertures 60a may correspond to one of the photoelectric conversion elements 12, but the present disclosure is not limited thereto.

In some embodiments, the material of the light-shielding layer 60 may include photoresist (e.g., black photoresist, or other applicable photoresist which is not transparent to specific wavelength), ink (e.g., black ink, or other applicable ink which is not transparent to specific wavelength), molding compound (e.g., black molding compound, or other applicable molding compound which is not transparent to specific wavelength), solder mask (e.g., black solder mask, or other applicable solder mask which is not transparent to specific wavelength), (black-)epoxy polymer, any other applicable material, or a combination thereof. In some embodiments, the material of the light-shielding layer 60 may include a light curing material, a thermal curing material, or a combination thereof, but the present disclosure is not limited thereto.

In some embodiments, the light-shielding layer 60 may be formed on the second metal-stacking layer 50 by a coating process or a patterning process. In some embodiments, the patterning process may include soft baking, mask aligning, exposure, post-exposure baking, developing, rinsing, drying, any other applicable process, or a combination thereof, but the present disclosure is not limited thereto.

As shown in FIG. 3, the width W of each of the apertures 60a in a direction D1 parallel with a top surface 10T of the substrate 10 may be greater than 1 μm, and less than 150 μm, but the present disclosure is not limited thereto. When the light filter structure 102 is used in the spectral inspection device, the spectral resolution may be determined by the sizes of the apertures 60a. That is, the spectral resolution may be enhanced by adjusting the sizes of the apertures 60a of the light-shielding layer 60.

Figure 4:
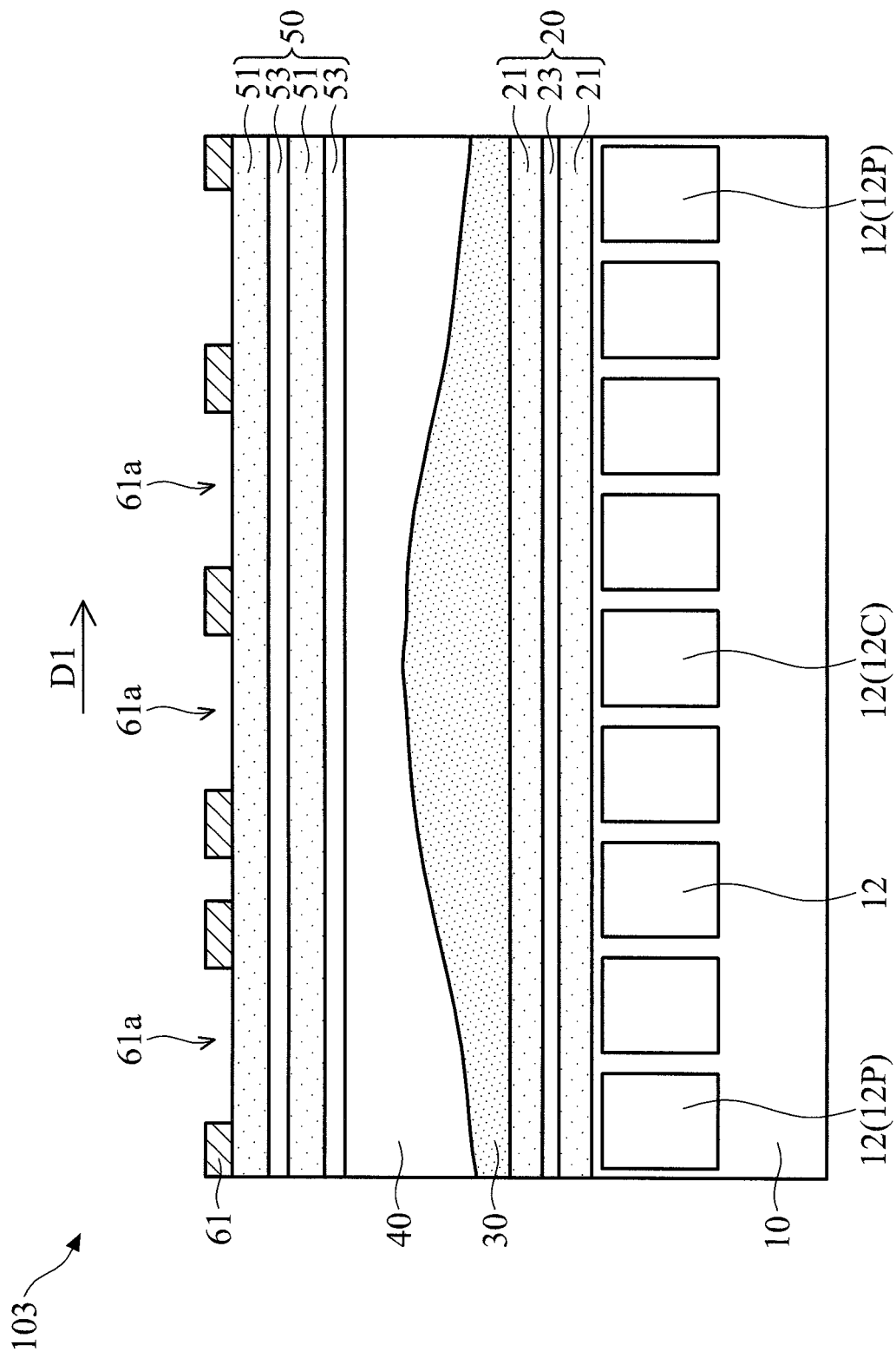
FIG. 4 is a partial cross-sectional view illustrating a light filter structure according to another embodiment of the present disclosure.

FIG. 4 is a partial cross-sectional view illustrating a light filter structure 103 according to another embodiment of the present disclosure. It should be noted that not all components of the light filter structure 103 are shown in FIG. 4, for the sake of brevity.

Referring to FIG. 4, the light filter structure 103 includes a substrate 10. Similarly, the substrate 10 may have a plurality of photoelectric conversion elements 12. The light filter structure 103 includes a first metal-stacking layer 20 disposed on the substrate 10. The light filter structure 103 also includes a graded layer 30 disposed on the first metal-stacking layer 20 and a flatting layer 40 disposed on the graded layer 30. The light filter structure 103 further includes a second metal-stacking layer 50 disposed on the flatting layer 40 and a light-shielding layer 61 disposed on the second metal-stacking layer 50.

As shown in FIG. 4, the light-shielding layer 61 may include a plurality of apertures 61a. In this embodiment, each of the apertures 61a may correspond to two of the photoelectric conversion elements 12, but the present disclosure is not limited thereto. In other embodiments, each of the apertures 61a may correspond to more than two of the photoelectric conversion elements 12.

In some embodiments, the material of the light-shielding layer 61 shown in FIG. 4 may be substantially the same as the material of the light-shielding layer 60 shown in FIG. 3, but the present disclosure is not limited thereto. In some embodiments, the light-shielding layer 61 may be formed on the second metal-stacking layer 50 by a coating process or a patterning process. In some embodiments, the patterning process may include soft baking, mask aligning, exposure, post-exposure baking, developing, rinsing, drying, any other applicable process, or a combination thereof, but the present disclosure is not limited thereto.

Similarly, when the light filter structure 103 is used in the spectral inspection device, the spectral resolution may be determined by the sizes of the apertures 61a. That is, the spectral resolution may be enhanced by adjusting the sizes of the apertures 61a.

Figure 5:
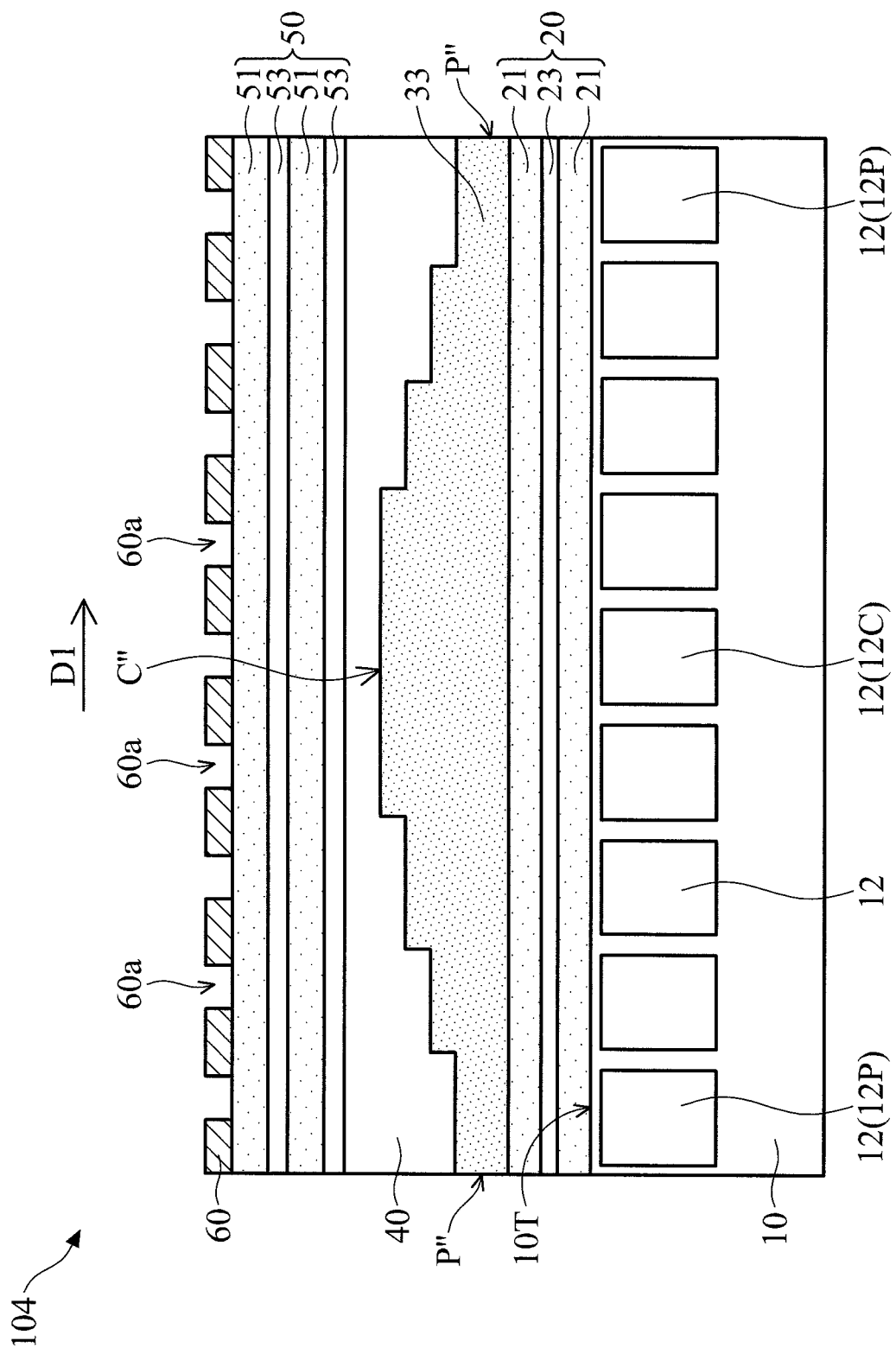
FIG. 5 is a partial cross-sectional view illustrating a light filter structure according to one embodiment of the present disclosure.

FIG. 5 is a partial cross-sectional view illustrating a light filter structure 104 according to one embodiment of the present disclosure. It should be noted that not all components of the light filter structure 104 are shown in FIG. 5, for the sake of brevity.

Referring to FIG. 5, the light filter structure 104 includes a substrate 10. Similarly, the substrate 10 may have a plurality of photoelectric conversion elements 12. The light filter structure 104 includes a first metal-stacking layer 20 disposed on the substrate 10. The light filter structure 104 also includes a graded layer 33 disposed on the first metal-stacking layer 20 and a flatting layer 40 disposed on the graded layer 33. The light filter structure 104 further includes a second metal-stacking layer 50 disposed on the flatting layer 40 and a light-shielding layer 60 disposed on the second metal-stacking layer 50. As shown in FIG. 5, the light-shielding layer 60 may include a plurality of apertures 60a. In this embodiment, each of the apertures 60a may correspond to one of the photoelectric conversion elements 12, but the present disclosure is not limited thereto.

The difference from the light filter structure 102 shown in FIG. 3 may include that the graded layer 33 of the light filter structure 104 shown in FIG. 5 may have a non-continuously varied thickness. For example, the graded layer 33 shown in FIG. 5 may have a step shape, but the present disclosure is not limited thereto.

In some embodiments, the material of the graded layer 33 shown in FIG. 5 may be substantially the same as the material of the graded layer 33 shown in FIGS. 1, 3 and 4, but the present disclosure is not limited thereto. In some embodiments, the graded layer 33 may be formed by a chemical vapor deposition process, an atomic layer deposition process, a physical vapor deposition process, or another suitable method, but the present disclosure is not limited thereto. For example, the chemical vapor deposition process may be low-pressure chemical vapor deposition, low-temperature chemical vapor deposition, rapid thermal chemical vapor deposition, or plasma-enhanced chemical vapor deposition.

Similarly, the graded layer 33 may thin from the center C''' of the graded layer 33 to the periphery P''' of the graded layer 33. That is, the thickness of the center C''' of the graded layer 33 may be the maximum thickness of the graded layer 33, while the thickness of the periphery P''' of the graded layer 33 may be the minimum thickness of the graded layer 33, but the present disclosure is not limited thereto.

In the embodiment shown in FIG. 5, when the refractive index of the flatting layer 40 is less than the refractive index of the graded layer 33 (e.g., the refractive index of the flatting layer 40 is 1.5 and the refractive index of the graded layer 33 is 2.5), the closer a photoelectric conversion element 12 is to the center of the light filter 104, the longer the wavelength of the light transmitted to the photoelectric conversion element 12 is. For example, the photoelectric conversion element 12C is close to the center of the light filter 104, so that the red light is transmitted to the photoelectric conversion element 12C; the photoelectric conversion element 12P is close to the periphery of the light filter 104, so that the blue light is transmitted to the photoelectric conversion element 12P, but the present disclosure is not limited thereto.

In the embodiment shown in FIG. 5, when the refractive index of the flatting layer 40 is greater than the refractive index of the graded layer 33 (e.g., the refractive index of the flatting layer 40 is 2.5 and the refractive index of the graded layer 33 is 1.5), the closer a photoelectric conversion element 12 is to the center of the light filter 104, the shorter the wavelength of the light transmitted to the photoelectric conversion element 12 is. For example, the photoelectric conversion element 12C is close to the center of the light filter 104, so that the blue light is transmitted to the photoelectric conversion element 12C; the photoelectric conversion element 12P is close to the periphery of the light filter 104, so that the red light is transmitted to the photoelectric conversion element 12P, but the present disclosure is not limited thereto.

Figure 6:
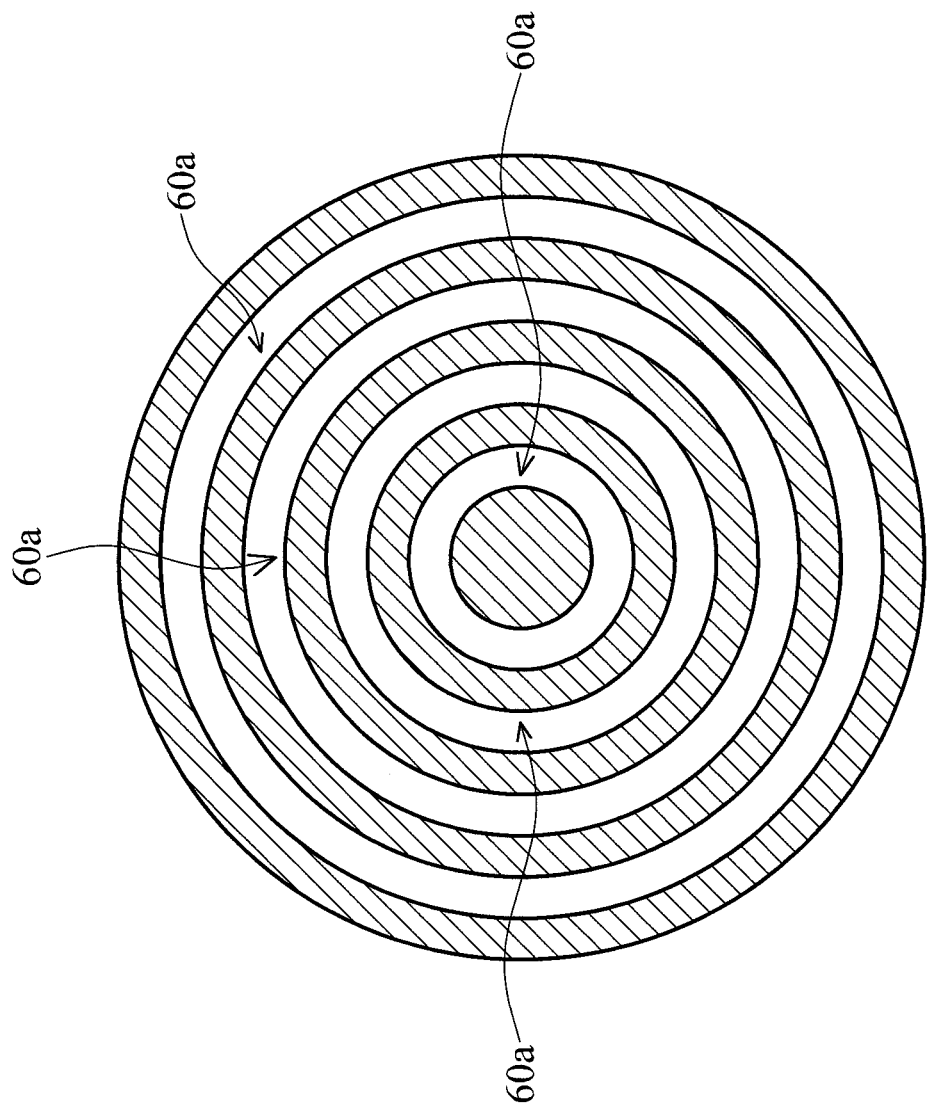
FIG. 6 is a partial top view illustrating the apertures of the light-shielding layer according to one embodiment of the present disclosure.

FIG. 6 is a partial top view illustrating the apertures 60a of the light-shielding layer 60 according to one embodiment of the present disclosure. It should be noted that a partial top view illustrating apertures 61a of the light-shielding layer 61 according to one embodiment of the present disclosure may be similar to FIG. 6.

In some embodiments, the apertures 60a of the light-shielding layer 60 may forms a symmetrical pattern. For example, the apertures 60a of the light-shielding layer 60 may be arranged in concentric circles as shown in FIG. 6, but the present disclosure is not limited thereto.

In summary, when the light filter structure of the embodiment according to the present disclosure is used as a narrow-band pass filter, it may have small thickness to meet demand. Moreover, the light filter structure of the embodiment according to the present disclosure may be low angle dependency. Therefore, the deformation of the spectrum due to oblique incident-light transmitted to the light filter structure of the embodiments according to the present disclosure may be reduced. Furthermore, when the light filter structure of some embodiments according to the present disclosure is used in the spectral inspection device, the spectral resolution may be enhanced by adjusting the sizes of the apertures of the light-shielding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined by the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A light filter structure, comprising:
   a substrate having a plurality of photoelectric conversion elements;
   a first metal-stacking layer disposed on the substrate;

a graded layer disposed on the first metal-stacking layer, wherein the graded layer has a continuously or non-continuously varied thickness;

a flatting layer disposed on the graded layer; and a second metal-stacking layer disposed on the flatting layer, wherein the first metal-stacking layer and the second metal-stacking layer each comprises at least one metal layer and at least one adhesion layer.

2. The light filter structure as claimed in claim 1, wherein a refractive index of the graded layer is different from a refractive index of the flatting layer.

3. The light filter structure as claimed in claim 1, wherein the graded layer gradually thins from a center of the graded layer to a periphery of the graded layer.

4. The light filter structure as claimed in claim 3, wherein a refractive index of the flatting layer is less than a refractive index of the graded layer.

5. The light filter structure as claimed in claim 3, wherein a refractive index of the flatting layer is greater than a refractive index of the graded layer.

6. The light filter structure as claimed in claim 1, wherein the graded layer gradually thickens from a center of the graded layer to a periphery of the graded layer.

7. The light filter structure as claimed in claim 6, wherein a refractive index of the flatting layer is less than a refractive index of the graded layer.

8. The light filter structure as claimed in claim 6, wherein a refractive index of the flatting layer is greater than a refractive index of the graded layer.

9. The light filter structure as claimed in claim 1, wherein the at least one adhesion layer is stacked with the at least one metal layer.

10. The light filter structure as claimed in claim 1, wherein a material of the at least one metal layer comprises gold, copper, aluminum, silver, or nickel.

11. The light filter structure as claimed in claim 1, wherein a material of the at least one adhesion layers comprises titanium, chromium, zinc oxide, or aluminium oxide.

12. The light filter structure as claimed in claim 1, wherein a total number of the at least one metal layer and the at least one adhesion layer in the first metal-stacking layer or a total number of the at least one metal layer and the at least one adhesion layer in the second metal-stacking layer is between 4 and 15.

13. The light filter structure as claimed in claim 1, wherein a total thickness of the first metal-stacking layer, the graded layer, the flatting layer and the second metal-stacking layer is less than 3 μm.

14. The light filter structure as claimed in claim 1, further comprising:

a light-shielding layer disposed on the second metal-stacking layer, wherein the light-shielding layer comprises a plurality of apertures.

15. The light filter structure as claimed in claim 14, wherein each of the plurality of apertures corresponds to one of the plurality of photoelectric conversion elements.

16. The light filter structure as claimed in claim 14, wherein a width of each of the plurality of apertures in a direction parallel with a top surface of the substrate is greater than 1 μm, and less than 150 μm.

17. The light filter structure as claimed in claim 14, wherein each of the plurality of apertures corresponds to at least two of the plurality of photoelectric conversion elements.

18. The light filter structure as claimed in claim 14, wherein the plurality of apertures forms a symmetrical pattern.

19. The light filter structure as claimed in claim 18, wherein the plurality of apertures is arranged in concentric circles.

20. The light filter structure as claimed in claim 1, wherein a material of the graded layer comprises zirconium dioxide, tantalum pentoxide, niobium pentoxide, zinc sulfide, titanium dioxide, indium tin oxide, tin oxide, zinc oxide, calcium fluoride, magnesium fluoride, lanthanum trifluoride, silicon dioxide, aluminium oxide, or hafnium dioxide.

* * * * *